United States Patent
Yamamoto

(10) Patent No.: US 11,695,415 B2
(45) Date of Patent: Jul. 4, 2023

(54) SEMICONDUCTOR DEVICE

(71) Applicant: LAPIS TECHNOLOGY CO., LTD., Kanagawa (JP)

(72) Inventor: Shouhei Yamamoto, Kanagawa (JP)

(73) Assignee: LAPIS TECHNOLOGY CO., LTD., Yokohama (JP)

(*) Notice: Subject to any disclaimer, the term of this patent is extended or adjusted under 35 U.S.C. 154(b) by 0 days.

(21) Appl. No.: 17/560,821

(22) Filed: Dec. 23, 2021

(65) Prior Publication Data
US 2022/0209769 A1    Jun. 30, 2022

(30) Foreign Application Priority Data
Dec. 28, 2020 (JP) ................................ 2020-219211

(51) Int. Cl.
| H03K 17/00 | (2006.01) |
| H03K 17/687 | (2006.01) |
| H03K 19/20 | (2006.01) |
| H03K 17/22 | (2006.01) |
| H03K 3/012 | (2006.01) |

(52) U.S. Cl.
CPC ......... *H03K 17/6872* (2013.01); *H03K 3/012* (2013.01); *H03K 17/22* (2013.01); *H03K 17/6874* (2013.01); *H03K 19/20* (2013.01)

(58) Field of Classification Search
CPC .... H03K 17/6872; H03K 3/012; H03K 17/22; H03K 17/6874; H03K 17/223; H03K 17/302; H03K 19/20
See application file for complete search history.

(56) References Cited

U.S. PATENT DOCUMENTS

| 5,103,115 | A | * | 4/1992 | Ueda .................... H03K 17/223 327/143 |
| 5,300,822 | A | * | 4/1994 | Sugahara ............. H03K 17/223 327/143 |
| 8,212,545 | B2 | * | 7/2012 | Imura ....................... G05F 3/24 327/542 |
| 9,632,521 | B2 | * | 4/2017 | Iriarte .................... G05F 3/242 |
| 2003/0052661 | A1 | * | 3/2003 | Tachimori ............... G05F 3/242 323/313 |
| 2011/0074470 | A1 | * | 3/2011 | Sanborn ............... H03K 17/223 327/143 |
| 2012/0092047 | A1 | * | 4/2012 | Chen .................... H03K 17/223 327/143 |
| 2014/0266314 | A1 | * | 9/2014 | Iriarte .................. H03K 5/2472 327/81 |

FOREIGN PATENT DOCUMENTS

JP          2014207615 A     10/2014

* cited by examiner

*Primary Examiner* — Tuan T Lam
(74) *Attorney, Agent, or Firm* — Volentine, Whitt & Francos, PLLC

(57) ABSTRACT

A power-on reset circuit 10 has: an enhancement-type PMOS transistor P1 whose source is connected to VDD and whose drain is connected to node VJG; a depletion-type NMOS transistor D1 whose drain is connected to the node VJG; a first resistor portion having resistors R1, R2 that are connected in series, and whose one end is connected to a source of the depletion-type NMOS transistor D1, and whose another end is connected to GND, and at which a region between the resistors R1, R2 is connected to a gate of the enhancement-type PMOS transistor P1; and an inverter whose input is connected to the node VJG, and that outputs a reset signal.

2 Claims, 11 Drawing Sheets

SEMICONDUCTOR DEVICE

CROSS-REFERENCE TO RELATED APPLICATION

This application is based on and claims priority under 35 USC 119 from Japanese Patent Application No. 2021-219211 filed on Dec. 28, 2020, the disclosure of which is incorporated by reference herein.

BACKGROUND

Technical Field

The present disclosure relates to a semiconductor device.

Related Art

A power-on reset circuit is a circuit that outputs a reset signal in a case in which the power supply voltage is less than or equal to a predetermined judgment voltage, in order to prevent internal circuits from malfunctioning at the time when the power is turned on.

In recent years, power-on reset circuits have been built into microcontrollers of semiconductor integrated circuits, and not only output a reset signal at the time when the power supply voltage is supplied, but also have the function of operating at all times and outputting a reset signal whenever the power supply voltage is lower than the judgment voltage.

Japanese Patent Application Laid-Open (JP-A) No 2014-207615 discloses, in a semiconductor device equipped with a power-on reset circuit, a technique in which, by providing a control element that controls the resistance value of a resistor portion in accordance with the output level, hysteresis can be produced, and the internal circuit can be operated stably and with high resistance to noise.

However, depending on the type of the microcontroller, the judgment voltage for outputting the reset signal varies. Therefore, power-on reset circuits that can set, in a wide range, the judgment voltage for outputting the reset signal are desired. In JP-A No. 2014-207615, for example, in a case in which the judgment voltage for outputting the reset signal is set to be high, i.e., in a case in which the threshold voltage of the transistor that determines the judgment voltage for outputting the reset signal is made to be large, the current amount increases because the current amount is proportional to the square of the threshold voltage of the transistor. Accordingly, although it is possible to set, in a broad range, the judgment voltage for outputting the reset signal with a circuit structure such as that of JP-A No. 2014-207615, there is the problem that the electric power that is consumed increases in cases in which the judgment voltage is set to be high.

SUMMARY

A semiconductor device of a first aspect has: a first enhancement-type element having a first control terminal and a pair of first main terminals, one of the first main terminals being connected to a region having a first potential, and another of the first main terminals being connected to a first node; a first depletion-type element having a second control terminal and a pair of second main terminals, one of the second main terminals being connected to the first node, and the second control terminal being connected to a region having a second potential; a first resistor portion having plural resistor elements connected in series, and having one end connected to another of the second main terminals of the first depletion-type element, and another end connected to the region having the second potential, a region between the plural resistor elements being connected to the first control terminal of the first enhancement-type element; and a first inverter having an input that is connected to the first node and outputting a reset signal.

A semiconductor device of a second aspect has: a first enhancement-type element having a first control terminal and a pair of first main terminals, one of the first main terminals being connected to a region having a first potential, another of the first main terminals being connected to a first node, and the first control terminal being connected to a second node; a second depletion-type element having a second control terminal and a pair of second main terminals, one of the second main terminals being connected to the first node, and another of the second main terminals being connected to the second node; a first depletion-type element having a third control terminal and a pair of third main terminals, one of the third main terminals being connected to the second node, and the third control terminal being connected to a region having a second potential; a first resistor portion having plural resistor elements connected in series, and having one end connected to another of the third main terminals of the first depletion-type element, and another end connected to the region having the second potential, a region between the plural resistor elements being connected to the control terminal of the second depletion-type element; and a first inverter having an input that is connected to the first node and outputting a reset signal.

A semiconductor device of a third aspect has: a first enhancement-type element having a first control terminal and a pair of first main terminals, one of the first main terminals being connected to a region having a first potential, another of the first main terminals being connected to a first node, and the first control terminal being connected to a second node; a third depletion-type element having a second control terminal and a pair of second main terminals, one of the second main terminals being connected to the first node, another of the second main terminals being connected to the second node, and the second control terminal being connected to a third node; a second depletion-type element having a third control terminal and a pair of third main terminals, one of the third main terminals being connected to the second node, and another of the third main terminals being connected to the third node; a first depletion-type element having a fourth control terminal and a pair of fourth main terminals, one of the fourth main terminals being connected to the third node, and the fourth control terminal being connected to a region having a second potential; a first resistor portion having plural resistor elements connected in series, one end connected to another of the fourth main terminals of the first depletion-type element, and another end connected to the region having the second potential, a region between the plural resistor elements being connected to the third control terminal of the second depletion-type element; and a first inverter having an input that is connected to the first node and outputting a reset signal.

A semiconductor device of a fourth aspect has: an enhancement-type element having one first main terminal that is connected to a region having a first potential, and another first main terminal that is electrically connected to a first node; a depletion-type element portion having, in series, one or more depletion-type elements that have one second main terminal at a first potential side and another second main terminal at a second potential side, the second potential being different from the first potential, and the depletion-type element portion being connected between the first node and a second node; and a resistor portion having one end that is electrically connected to the second node, and another end that is connected to a region having the second potential, wherein a control terminal of the enhancement-type element is connected to the other second main terminal of the depletion-type element that is closest to the enhancement-type element in the depletion-type element portion.

In accordance with the present disclosure, the effect of being able to set, in a broad range, a judgment voltage for outputting a reset signal is achieved.

BRIEF DESCRIPTION OF THE DRAWINGS

Exemplary embodiments of the present disclosure will be described in detail based on the following figures, wherein.

DETAILED DESCRIPTION

Embodiments will be described in detail hereinafter with reference to the drawings.

First Embodiment

Figure 1:
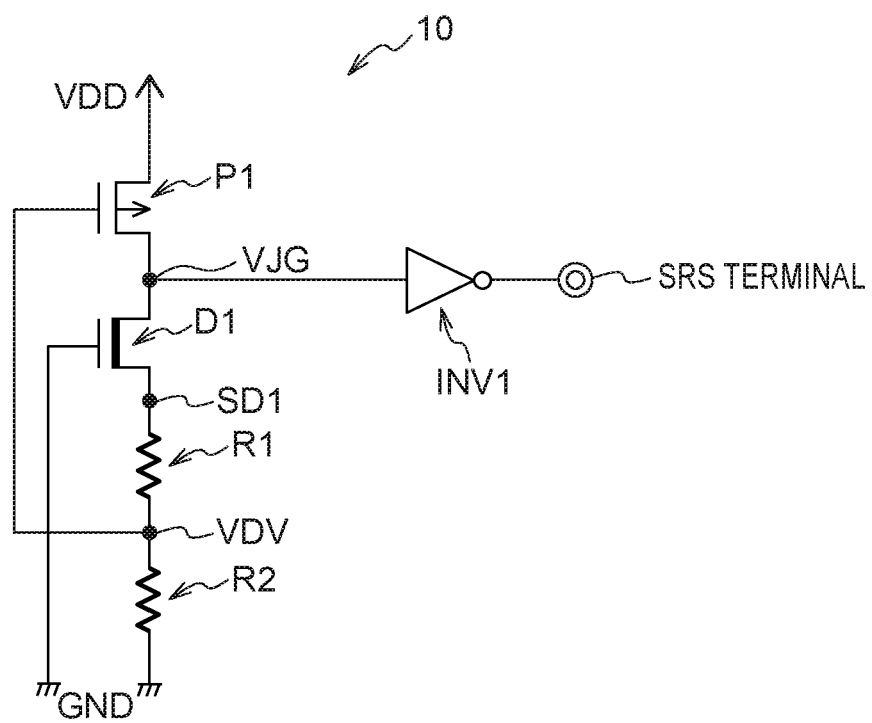
FIG. 1 is a circuit diagram showing an example of a power-on reset circuit of a first embodiment.

First, the structure of a power-on reset circuit 10 of the present embodiment is described. A circuit diagram for explaining an example of the power-on reset circuit of the present embodiment is shown in FIG. 1. The power-on reset circuit 10 of the present embodiment has an enhancement-type PMOS transistor P1, a depletion-type NMOS transistor D1, a first resistor portion (resistor R1, resistor R2) and an inverter INV1. The power-on reset circuit 10 is incorporated in an LSI internal circuit for example.

The enhancement-type PMOS transistor P1 has a control terminal and a pair of first main terminals. Here, the control terminal is the gate, and the pair of first main terminals are the source and the drain. Hereinafter, description is given by using the gate as the control terminal, and the source or the drain as the main terminal. The source of the enhancement-type PMOS transistor P1 is connected to a region (hereinafter called power supply potential) that has power supply voltage (VDD), and the drain is connected to node VJG. The gate of the enhancement-type PMOS transistor P1 is connected via the resistor R2 to a region (hereinafter called ground potential) that has ground voltage (GND). The enhancement-type PMOS transistor P1 is an example of the enhancement-type element.

The depletion-type NMOS transistor D1 has a control terminal and a pair of second main terminals. Here, the control terminal is the gate, and the pair of second main terminals are the source and the drain. Hereinafter, description is given by using the gate as the control terminal, and the source or the drain as the main terminal. The drain of the depletion-type NMOS transistor D1 is connected to the node VJG. The source is connected to node SD1 that is connected to one end of the resistor R1. The gate of the depletion-type NMOS transistor D1 is connected to ground potential. The depletion-type NMOS transistor D1 is an example of the depletion-type element.

At the first resistor portion, the resistor R1 and the resistor R2 are connected in series. One end of the resistor R1 is connected to the node SD1, and the other end of the resistor R1 is connected to node VDV. One end of the resistor R2 is connected to the node VDV, and the other end of the resistor R2 is connected to ground potential. The gate of the enhancement-type PMOS transistor P1 is connected to the node VDV. The resistance values of the resistor R1 and the resistor R2 are respectively set in accordance with the type of the microcontroller.

The input terminal of the inverter INV1 is connected to the node VJG. A reset signal, which is outputted from the output terminal of the inverter INV1 in accordance with the voltage of the node VJG, is supplied from an SRS terminal to an LSI internal circuit or the like in which the power-on reset circuit 10 is incorporated.

At the power-on reset circuit 10 of the present embodiment, in a case in which VDD is sufficiently high, the depletion-type NMOS transistor D1, the resistor R1 and the resistor R2 function as a constant voltage circuit that supplies a constant voltage to the gate of the enhancement-type PMOS transistor P1.

Figure 2:
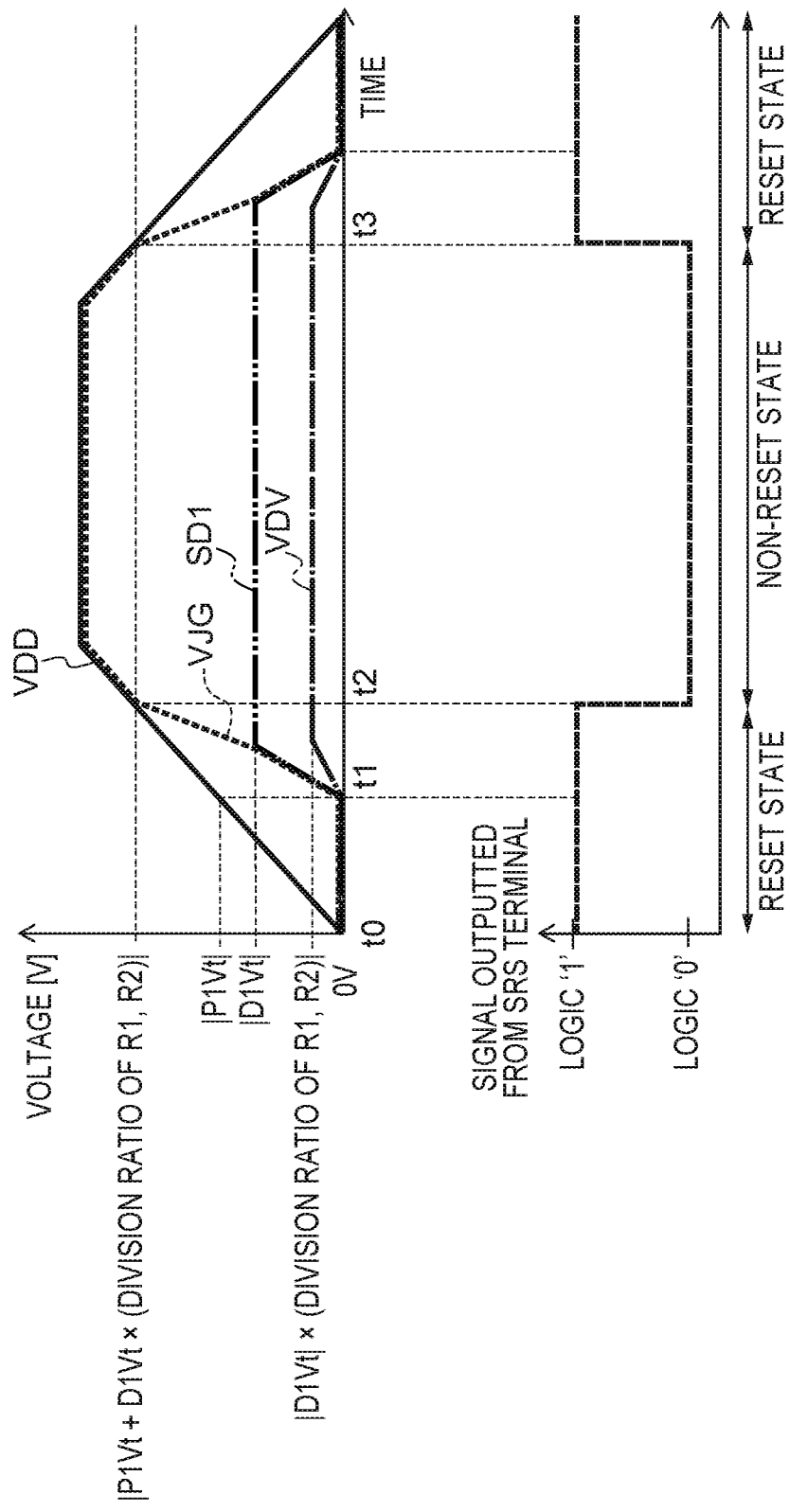
FIG. 2 is a drawing showing an example of voltage waveforms and an outputted signal of the power-on reset circuit of the first embodiment.

Operation of the power-on reset circuit 10 of the present embodiment is described next. The upper part of FIG. 2 shows voltage waveforms, and the lower part shows the signal that is outputted from the SRS terminal and that expresses a reset state or a non-reset state (logic '0' or logic '1'). In the upper part of FIG. 2, the waveform at the time of operation of VDD, the waveform at the time of operation of the voltage of the node VJG, the waveform at the time of operation of the voltage of the node VDV and the waveform at the time of operation of the voltage of the node SD1 are shown by the solid line, the dotted line, the one-dot chain line and the two-dot chain line, respectively.

Note that it is assumed that the threshold voltage of the enhancement-type PMOS transistor P1 is P1Vt, and the threshold voltage of the depletion-type NMOS transistor D1 is D1Vt. The threshold voltage D1Vt of the depletion-type NMOS transistor D1 is a negative value, and is on even when the source is 0V and the gate is 0V. Here, |P1Vt| is greater than |D1Vt|.

First, during the time period when the time is greater than or equal to time t0 and less than time t1, VDD is greater than or equal to 0V and less than |P1Vt|. At this time, the enhancement-type PMOS transistor P1 is off, and the depletion-type NMOS transistor D1 is on. Therefore, the voltage of the node VDV of the gate of the enhancement-type PMOS transistor P1, the voltage of the node SD1 of the source of the depletion-type NMOS transistor D1, and the voltage of the node VJG are pulled toward the GND side and are 0V. The signal outputted from the inverter INV1 and the signal outputted from the SRS terminal are logic '1' in accordance with the voltage of the node VJG being GND level which is a state of not having reached VDD. Accordingly, this state during the time period when VDD is from 0V to less than |P1Vt| is a state in which the reset signal is being outputted, i.e., is the reset state.

Next, at time t1, VDD is greater than or equal to |P1Vt|, and is less than |P1Vt+D1Vt×(division ratio of the resistances of the resistors R1, R2)|. At this time, it is only after the enhancement-type PMOS transistor P1 turns on that current I1 starts to flow, but, in a case in which the resistance values of the resistor R1 and the resistor R2 are sufficiently large, the voltage of the node VDV of the gate of the enhancement-type PMOS transistor P1 rises by I1×(resistance value of the resistor R2). Therefore, the enhancement-type PMOS transistor P1 is not completely on. Although the voltage of the node VJG rises accompanying the rise in VDD, the voltage of the node VJG does not reach VDD and remains as is at GND level, and therefore, the signal outputted from the inverter INV1 and the signal outputted from the SRS terminal do not change and are logic '1'. Accordingly, the reset state continues during the time period when VDD is greater than or equal to |P1Vt| and is less than |P1Vt+D1Vt×(division ratio of the resistances of the resistors R1, R2)|, i.e., also in cases in which the time is greater than or equal to time t1 and less than time t2.

At time t2, VDD is greater than or equal to |P1Vt+D1Vt×(division ratio of the resistances of the resistors R1, R2)|. At this time, because the gate of the depletion-type NMOS transistor D1 is connected to GND, in a case in which the resistance values of the resistor R1 and the resistor R2 are sufficiently large, the voltage of the node SD1 of the source of the depletion-type NMOS transistor D1 is around |D1Vt|, and does not rise any more than this and is a constant voltage. Further, the voltage of the node SD1 is divided, and the voltage of the node VDV of the gate of the enhancement-type PMOS transistor P1 is |D1Vt|×(division ratio of the resistances of the resistors R1, R2). The voltage of the node VDV of the gate of the enhancement-type PMOS transistor P1 is a constant voltage, and when VDD rises and the source voltage becomes high to around P1Vt as compared with the gate voltage of the enhancement-type PMOS transistor P1, the enhancement-type PMOS transistor P1 is turned on completely. Then, the voltage of the node VJG is pulled toward the VDD side and becomes high voltage, and, in accordance with the voltage of the node VJG being VDD level which is the state of having reached VDD, the signal that is outputted from the inverter INV1 and the signal that is outputted from the SRS terminal become logic '0'. Accordingly, when VDD is greater than or equal to |P1Vt+D1Vt×(division ratio of the resistances of the resistors R1, R2)|, i.e., also in cases in which the time is greater than or equal to time t2 and less than time t3, there is a state in which the reset signal is not outputted, i.e., there is the non-reset state. In this way, VDD=|P1Vt+D1Vt×(division ratio of the resistances of the resistors R1, R2)|, at which the reset state and the non-reset state are switched, is the judgment voltage.

Further, at time t3, when VDD starts to fall, VDD becomes less than |P1Vt+D1Vt×(division ratio of the resistances of the resistors R1, R2)|, and the enhancement-type PMOS transistor P1 again is not completely on. Then, in accordance with the voltage of the node VJG becoming GND level, the signal outputted from the inverter INV1 and the signal outputted from the SRS terminal become logic '1'. Then, there is the reset state again.

Namely, if VDD is less than the judgment voltage |P1Vt+D1Vt×(division ratio of the resistances of the resistors R1, R2)|, the enhancement-type PMOS transistor P1 is not completely on, and therefore, the voltage of the node VJG is GND level, and there is the reset state. On the other hand, if VDD is greater than or equal to the judgment voltage |P1Vt+D1Vt×(division ratio of the resistances of the resistors R1, R2)|, the enhancement-type PMOS transistor P1 is completely on, and the voltage of the node VJG is VDD level, and there is the non-reset state.

Further, when VDD is sufficiently high, the depletion-type NMOS transistor D1, the resistor R1 and the resistor R2 function as a constant voltage circuit. Therefore, the current at this time is constant, and the current that is consumed is |D1Vt|÷(sum of the resistances of the resistors R1, R2). Namely, the current that is consumed does not depend on the enhancement-type PMOS transistor P1 that determines the judgment voltage at which the reset signal is outputted. Accordingly, the electric power that is consumed does not increase even in a case in which the judgment voltage for outputting the reset signal is set to be high.

Further, for example, it is assumed that the threshold voltage of the depletion-type NMOS transistor D1 is D1Vt=−0.4V, the threshold voltage of the enhancement-type PMOS transistor P1 is P1Vt=−0.6V, the sum of the resistances of the resistors R1, R2 is 10 MegΩ, and the resistors R1, R2 are the same resistors. In this case, the judgment voltage for outputting the reset signal is |−0.6V|+|−0.4V|× 0.5, i.e., is 0.8V. Further, because the division ratio of the resistances of the resistors R1, R2 can be changed from 0 to up to 1, the judgment voltage for outputting the reset signal can be changed from 0.6V to up to 1.0V. At this time, without changing the sum of the resistances of the resistor R1 and the resistor R2, the division ratio is changed, and the judgment voltage for outputting the reset signal is changed. Therefore, the electric power that is consumed does not increase.

As described above, the power-on reset circuit 10 of the present embodiment has: the enhancement-type PMOS transistor P1 whose source is connected to the power supply potential and whose drain is connected to the node VJG; and the depletion-type NMOS transistor D1 whose drain is connected to the node VJG and whose gate is connected to ground potential. The power-on reset circuit 10 has: the resistor portion having the resistors R1, R2 that are connected in series, and whose one end is connected to the source of the depletion-type NMOS transistor D1, and whose other end is connected to ground potential, and at which the region between the resistors R1, R2 is connected to the gate of the enhancement-type PMOS transistor P1; and the inverter whose input is connected to the node VJG, and that outputs a reset signal. Due thereto, a power-on reset circuit, at which a judgment voltage for outputting a reset signal can be set in a wide range without increasing the electric power that is consumed, can be realized.

Further, the gate of the enhancement-type PMOS transistor P1 is connected to the node VDV that is between the resistor R1 and the resistor R2 and at which the voltage of the source of the depletion-type NMOS transistor D1 and ground potential are divided. Due thereto, by changing the division ratio of the resistors R1, R2, the judgment voltage for outputting the reset signal can be set without increasing the electric power that is consumed.

Further, the gate of the depletion-type NMOS transistor D1 is connected to a constant voltage source such as ground potential or the like, and plural resistors are provided between the source of the depletion-type NMOS transistor D1 and ground potential, and the source voltage of the depletion-type NMOS transistor D1 can be set. Further, the node, which divides the set source voltage of the depletion-type NMOS transistor D1, is connected to the gate of the enhancement-type PMOS transistor P1, and the judgment voltage for the reset signal can be set by controlling the on state of the enhancement-type PMOS transistor P1.

Second Embodiment

Figure 3:
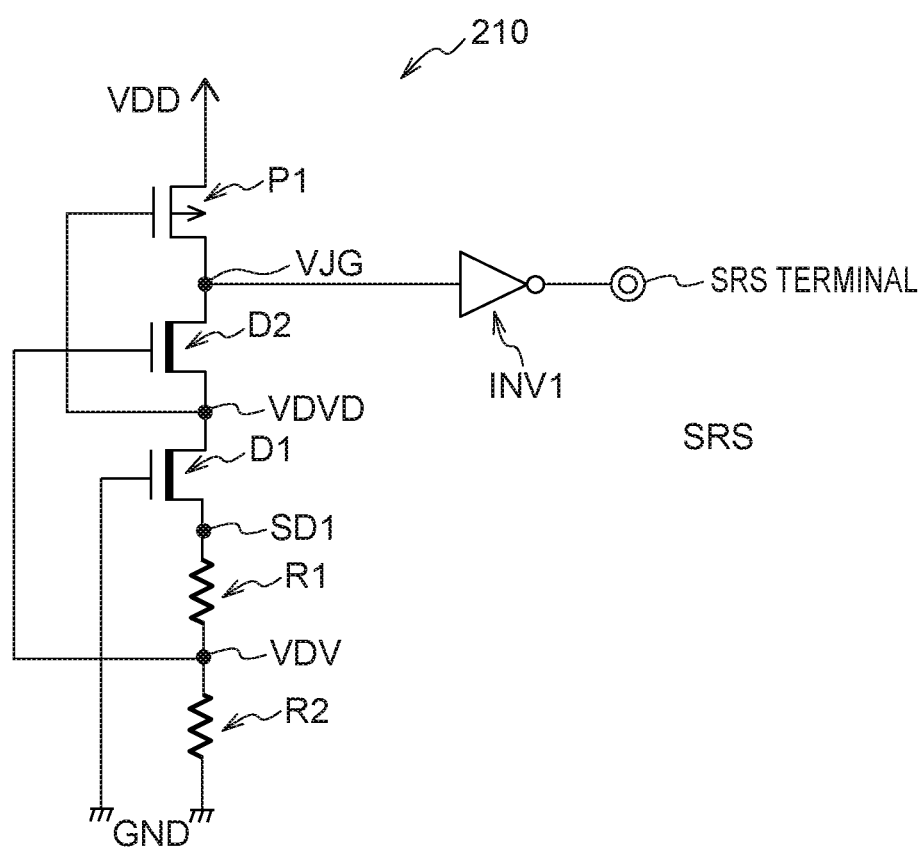
FIG. 3 is a circuit diagram showing an example of a power-on reset circuit of a second embodiment.

First, the structure of a power-on reset circuit 210 of the present embodiment is described. A circuit diagram for explaining an example of the power-on reset circuit of the present embodiment is shown in FIG. 3. The power-on reset circuit 210 of the present embodiment is a structure in which a depletion-type NMOS transistor D2 is added to the power-on reset circuit 10 of the first embodiment, and differs from the power-on reset circuit 10 of the first embodiment. Because the other points in FIG. 3 are the same of those of the case of FIG. 1, description is given by denoting the same or corresponding portions by the same reference numerals.

The power-on reset circuit 210 of the present embodiment has the enhancement-type PMOS transistor P1, the depletion-type NMOS transistor D2, the depletion-type NMOS transistor D1, the first resistor portion (the resistor R1, the resistor R2) and the inverter INV1. The power-on reset circuit 210 is incorporated in an LSI internal circuit for example.

The enhancement-type PMOS transistor P1 has a control terminal and a pair of first main terminals. Here, the control terminal is the gate, and the pair of first main terminals are the source and the drain. Hereinafter, description is given by using the gate as the control terminal, and the source or the drain as the main terminal. The source of the enhancement-type PMOS transistor P1 is connected to the power supply potential, and the drain is connected to the node VJG. The gate of the enhancement-type PMOS transistor P1 is connected via the depletion-type NMOS transistor D1 and the resistors R1, R2 to ground potential. The enhancement-type PMOS transistor P1 is an example of the enhancement-type element.

The depletion-type NMOS transistor D2 has a control terminal and a pair of second main terminals. Here, the control terminal is the gate, and the pair of second main terminals are the source and the drain. Hereinafter, description is given by using the gate as the control terminal, and the source or the drain as the main terminal. The drain of the depletion-type NMOS transistor D2 is connected to the node VJG. The source is connected to node VDVD. The gate of the depletion-type NMOS transistor D2 is connected via the resistor R2 to ground potential. The gate of the enhancement-type PMOS transistor P1 is connected to the node VDVD. The depletion-type NMOS transistor D2 is an example of the depletion-type element.

The depletion-type NMOS transistor D1 has a control terminal and a pair of third main terminals. Here, the control terminal is the gate, and the pair of third main terminals are the source and the drain. Hereinafter, description is given by using the gate as the control terminal, and the source or the drain as the main terminal. The drain of the depletion-type NMOS transistor D1 is connected to the node VDVD. The source of the depletion-type NMOS transistor D1 is connected to the node SD1 that is connected to one end of the resistor R1. The gate of the depletion-type NMOS transistor D1 is connected to ground potential. The depletion-type NMOS transistor D1 is an example of the depletion-type element.

At the first resistor portion, the resistor R1 and the resistor R2 are connected in series. One end of the resistor R1 is connected to the node SD1, and the other end of the resistor R1 is connected to node VDV. One end of the resistor R2 is connected to the node VDV, and the other end of the resistor R2 is connected to ground potential. The gate of the depletion-type NMOS transistor D2 is connected to the node VDV. The resistance values of the resistor R1 and the resistor R2 are respectively set in accordance with the type of the microcontroller.

The input terminal of the inverter INV1 is connected to the node VJG. A reset signal, which is outputted from the output terminal of the inverter INV1 in accordance with the voltage of the node VJG, is supplied from the SRS terminal to an LSI internal circuit or the like in which the power-on reset circuit 210 is incorporated.

At the power-on reset circuit 210 of the present embodiment, in a case in which VDD is sufficiently high, the depletion-type NMOS transistor D1, the resistor R1 and the resistor R2 function as a constant voltage circuit that supplies a constant voltage to the gate of the depletion-type NMOS transistor D2. Further, the depletion-type NMOS transistor D2 functions as a constant voltage circuit that supplies a constant voltage to the gate of the enhancement-type PMOS transistor P1.

Figure 4:
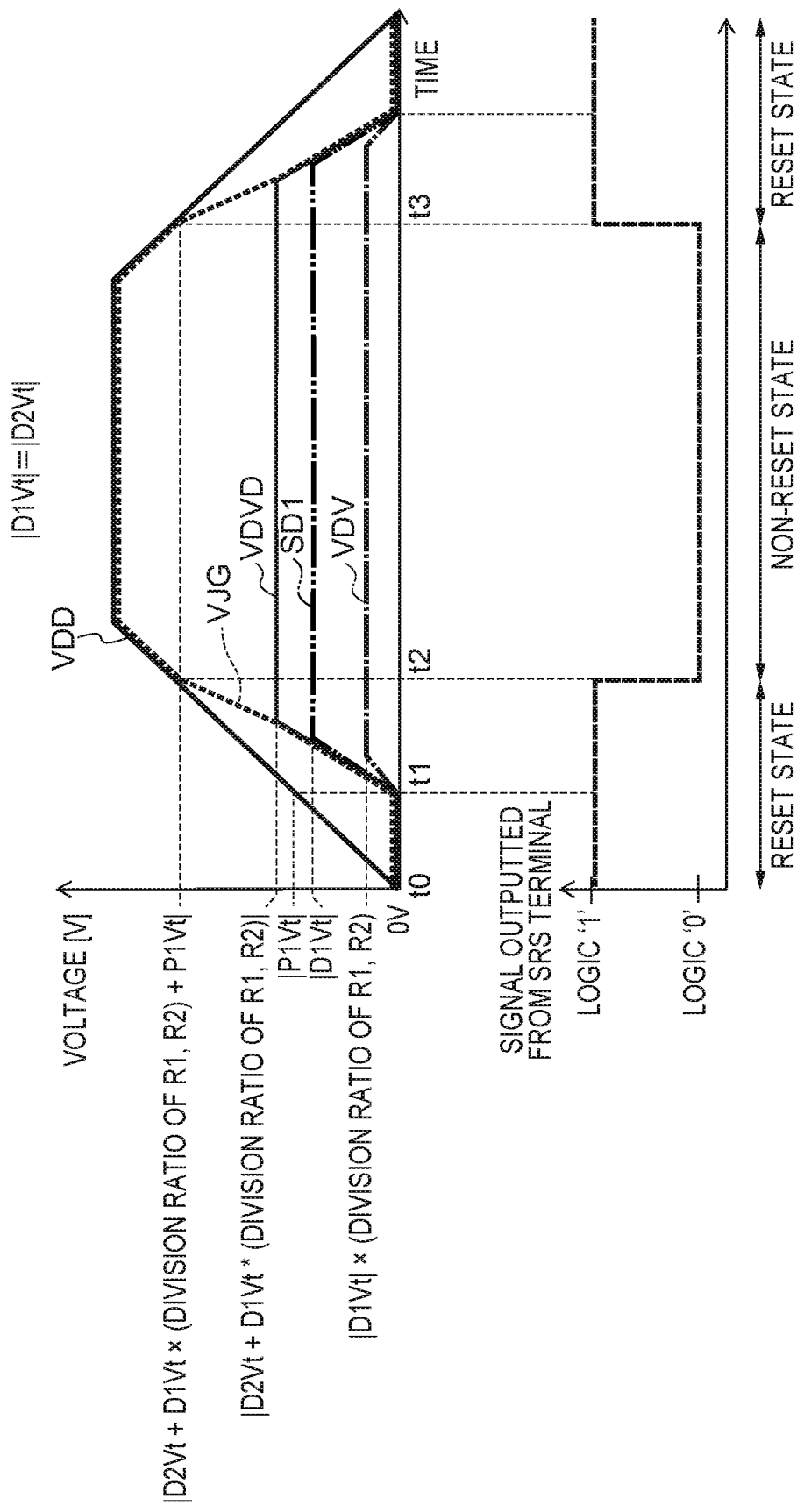
FIG. 4 is a drawing showing an example of voltage waveforms and an outputted signal of the power-on reset circuit of the second embodiment.

Operation of the power-on reset circuit 210 of the present embodiment is described next. The upper part of FIG. 4 shows voltage waveforms, and the lower part shows the signal that is outputted from the SRS terminal and that expresses a reset state or a non-reset state (logic '0' or logic '1'). In the upper part of FIG. 4, the waveform at the time of operation of VDD, the waveform at the time of operation of the voltage of the node VJG, the waveform at the time of operation of the voltage of the node VDV, the waveform at the time of operation of the voltage of the node SD1 and the waveform at the time of operation of the voltage of the node VDVD are shown by the solid line, the dotted line, the one-dot chain line, the two-dot chain line and the solid line, respectively.

Note that it is assumed that the threshold voltage of the enhancement-type PMOS transistor P1 is P1Vt, the threshold voltage of the depletion-type NMOS transistor D2 is D2Vt, and the threshold voltage of the depletion-type NMOS transistor D1 is D1Vt. The threshold voltage D2Vt of the depletion-type NMOS transistor D2 and the threshold voltage D1Vt of the depletion-type NMOS transistor D1 are negative values, and are on even when the source is 0V and the gate is 0V. Further, here, |P1Vt| is greater than |D1Vt| and |D2Vt|, and |D1Vt|=|D2Vt|.

First, during the time period when the time is greater than or equal to time t0 and less than time t1, VDD is greater than or equal to 0V and less than |P1Vt|. At this time, the enhancement-type PMOS transistor P1 is off, and the depletion-type NMOS transistors D1, D2 are on. Therefore, the voltage of the node VDV of the gate of the depletion-type NMOS transistor D2, the voltage of the node SD1 of the source of the depletion-type NMOS transistor D1, the voltage of the node VDVD of the gate of the enhancement-type PMOS transistor P1, and the voltage of the node VJG are pulled toward the GND side and are 0V. The signal outputted from the inverter INV1 and the signal outputted from the SRS terminal are logic '1' in accordance with the voltage of the node VJG being GND level which is a state of not having reached VDD. Accordingly, this state at the time when VDD is from 0V to less than |P1Vt| is a state in which the reset signal is being outputted, i.e., is the reset state.

Next, at time t1, VDD is greater than or equal to |P1Vt|, and is less than |D2Vt+D1Vt×(division ratio of the resistances of the resistors R1, R2)+P1Vt|. At this time, it is only after the enhancement-type PMOS transistor P1 turns on that the current I1 starts to flow, but, in a case in which the resistance values of the resistor R1 and the resistor R2 are sufficiently large, the voltage of the node VDVD of the gate of the enhancement-type PMOS transistor P1 rises by I1×(resistance value of the resistor R2)+|D2Vt|. Therefore, the enhancement-type PMOS transistor P1 is not completely on. Although the voltage of the node VJG rises accompanying the rise in VDD, the voltage of the node VJG does not reach VDD and remains as is at GND level, and therefore, the signal outputted from the inverter INV1 and the signal outputted from the SRS terminal do not change and are logic '1'. Accordingly, the reset state continues at the time when VDD is greater than or equal to |P1Vt| and is less than |D2Vt+D1Vt×(division ratio of the resistances of the resistors R1, R2)+P1Vt|, i.e., also in cases in which the time is greater than or equal to time t1 and less than time t2.

At time t2, VDD is greater than or equal to |D2Vt+D1Vt×(division ratio of the resistances of the resistors R1, R2)+P1Vt|. At this time, because the gate of the depletion-type NMOS transistor D1 is connected to GND, in a case in which the resistance values of the resistor R1 and the resistor R2 are sufficiently large, the voltage of the node SD1 of the source of the depletion-type NMOS transistor D1 is around |D1Vt|, and does not rise any more than this and is a constant voltage. Further, the voltage of the node SD1 is divided, and the voltage of the node VDV of the gate of the depletion-type NMOS transistor D2 is |D1Vt|×(division ratio of the resistances of the resistors R1, R2). Because the gate of the depletion-type NMOS transistor D2 is the voltage of the node VDV, the voltage of the node VDVD of the source of the depletion-type NMOS transistor D2 is |D1Vt|×(division ratio of the resistances of the resistors R1, R2)+|D2Vt|. The voltage of the node VDVD of the gate of the enhancement-type PMOS transistor P1 is a constant voltage, and when VDD rises and the source voltage becomes high to around P1Vt as compared with the gate voltage of the enhancement-type PMOS transistor P1, the enhancement-type PMOS transistor P1 is completely on. Then, the voltage of the node VJG is pulled toward the VDD side and becomes high voltage, and, in accordance with the voltage of the node VJG being VDD level which is the state of having reached VDD, the signal that is outputted from the inverter INV1 and the signal that is outputted from the SRS terminal become logic '0'. Accordingly, when VDD is greater than or equal to |D2Vt+D1Vt×(division ratio of the resistances of the resistors R1, R2)+P1Vt|, i.e., also in cases in which the time is greater than or equal to time t2 and less than time t3, there is a state in which the reset signal is not outputted, i.e., there is the non-reset state. In this way, VDD=|D2Vt+D1Vt×(division ratio of the resistances of the resistors R1, R2)+P1Vt|, at which the reset state and the non-reset state are switched, is the judgment voltage.

Further, at time t3, when VDD starts to fall, VDD becomes less than |D2Vt+D1Vt×(division ratio of the resistances of the resistors R1, R2)+P1Vt|, and the enhancement-type PMOS transistor P1 again is not completely on. Then, in accordance with the voltage of the node VJG becoming GND level, the signal outputted from the inverter INV1 and the signal outputted from the SRS terminal become logic '1'. Then, the reset state is established again.

Namely, if VDD is less than the judgment voltage |D2Vt+D1Vt×(division ratio of the resistances of the resistors R1, R2)+P1Vt|, the enhancement-type PMOS transistor P1 is not completely on, and therefore, the voltage of the node VJG is GND level, and there is the reset state. On the other hand, if VDD is greater than or equal to the judgment voltage |D2Vt+D1Vt×(division ratio of the resistances of the resistors R1, R2)+P1Vt|, the enhancement-type PMOS transistor P1 is completely on, and the voltage of the node VJG becomes VDD level, and there is the non-reset state.

Further, when VDD is sufficiently high, the depletion-type NMOS transistor D2, the depletion-type NMOS transistor D1, the resistor R1 and the resistor R2 function as a constant voltage circuit. Therefore, the current at this time is constant, and the consumed current is |D2Vt+D1Vt|÷(sum of the resistances of the resistors R1, R2). Namely, the current that is consumed does not depend on the enhancement-type PMOS transistor P1 that determines the judgment voltage for outputting the reset signal. Accordingly, the electric power that is consumed does not increase even in a case in which the judgment voltage for outputting the reset signal is set to be high.

Further, for example, it is assumed that the threshold voltage of the depletion-type NMOS transistor D1 is D1Vt=−0.4V, the threshold voltage of the depletion-type NMOS transistor D2 is D2Vt=−0.4V, the threshold voltage of the enhancement-type PMOS transistor P1 is P1Vt=−0.6V, the sum of the resistances of the resistors R1, R2 is 10 MegΩ, and the resistors R1, R2 are the same resistors. In this case, the judgment voltage for outputting the reset signal is |−0.6V|+|−0.4V|×0.5+|−0.4V|, i.e., is 1.2V. Further, because the division ratio can be changed from 0 to up to 1, the judgment voltage for outputting the reset signal can be changed from 1.0V to up to 1.4V. At this time, without changing the sum of the resistances of the resistor R1 and the resistor R2, the division ratio is changed, and the judgment voltage for outputting the reset signal is changed. Therefore, the electric power that is consumed does not increase.

As described above, the power-on reset circuit 210 of the present embodiment has: the enhancement-type PMOS transistor P1 whose source is connected to the power supply potential, whose drain is connected to the node VJG, and whose gate is connected to the node VDVD that is connected to the source of the depletion-type NMOS transistor D2; the depletion-type NMOS transistor D2 whose drain is connected to the node VJG and whose gate is connected to the node VDV; and the depletion-type NMOS transistor D1 whose drain is connected to the source of the depletion-type NMOS transistor D2 and whose gate is connected to ground potential. The power-on reset circuit 210 has: the resistor portion having the resistors R1, R2 that are connected in series, and whose one end is connected to the source of the depletion-type NMOS transistor D1, and whose other end is connected to ground potential, and at which the region between the resistors R1, R2 is connected to the gate of the depletion-type NMOS transistor D2; and the inverter whose input is connected to the node VJG, and that outputs a reset signal. Due thereto, a power-on reset circuit, at which a judgment voltage for outputting a reset signal can be set in a wide range without increasing the electric power that is consumed, can be realized.

Further, the gate of the enhancement-type PMOS transistor P1 is connected to the source of the depletion-type NMOS transistor D2, and further, the gate of the depletion-type NMOS transistor D2 is connected to the node VDV that is between the resistors R1, R2. Due thereto, by changing the division ratio of the resistors R1 and R2, the judgment voltage for outputting the reset signal can be set without increasing the electric power that is consumed. Further, by adding the depletion-type NMOS transistor D2, the judgment voltage for outputting the reset signal can be set to a voltage that is higher, by D2Vt, than that of the first embodiment.

Further, the gate of the depletion-type NMOS transistor D1 is connected to a constant voltage source such as ground potential or the like, and the plural resistors are provided between the source of the depletion-type NMOS transistor D1 and ground potential, and the source voltage of the depletion-type NMOS transistor D1 can be set. Further, the depletion-type NMOS transistor D2 is vertically stacked at the drain of the depletion-type NMOS transistor D1, and the gate of the depletion-type NMOS transistor D2 is connected to the node that divides the set source voltage of the depletion-type NMOS transistor D1, and the on state of the enhancement-type PMOS transistor P1 is controlled. Due thereto, the judgment voltage for resetting can be set to be higher than in the first embodiment.

Third Embodiment

Figure 5:
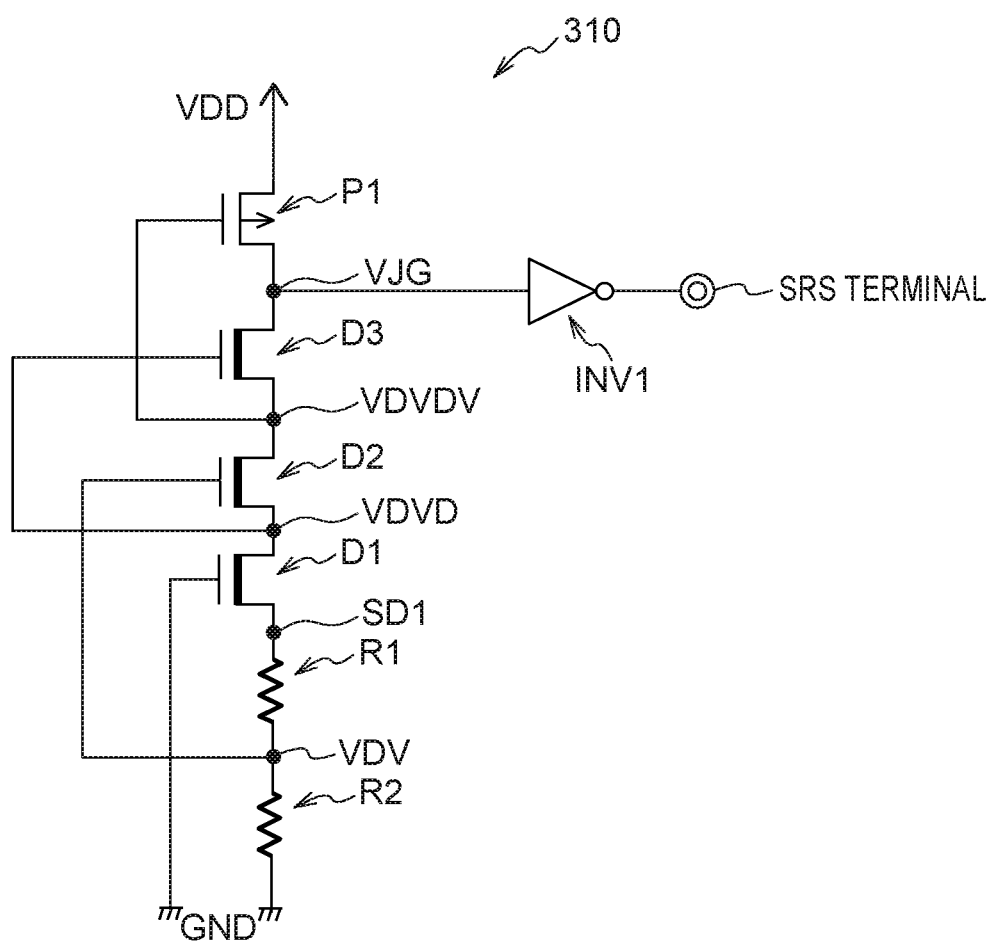
FIG. 5 is a circuit diagram showing an example of a power-on reset circuit of a third embodiment.

First, the structure of a power-on reset circuit of the present embodiment is described. A circuit diagram for explaining an example of the power-on reset circuit of the present embodiment is shown in FIG. 5. A power-on reset circuit 310 of the present embodiment is a structure in which a depletion-type NMOS transistor D3 is added to the power-on reset circuit 210 of the second embodiment. Because the other points in FIG. 5 are the same of those of the case of FIG. 3, description is given by denoting the same or corresponding portions by the same reference numerals.

The power-on reset circuit 310 of the present embodiment has the enhancement-type PMOS transistor P1, the depletion-type NMOS transistor D3, the depletion-type NMOS transistor D2, the depletion-type NMOS transistor D1, the first resistor portion (the resistor R1, the resistor R2) and the inverter INV1. The power-on reset circuit 310 is incorporated in an LSI internal circuit for example.

The enhancement-type PMOS transistor P1 has a control terminal and a pair of first main terminals. Here, the control terminal is the gate, and the pair of first main terminals are the source and the drain. Hereinafter, description is given by using the gate as the control terminal, and the source or the drain as the main terminal. The source of the enhancement-type PMOS transistor P1 is connected to the power supply potential, and the drain is connected to the node VJG. The gate of the enhancement-type PMOS transistor P1 is connected via the depletion-type NMOS transistors D2, D1 and the resistors R1, R2 to ground potential. The enhancement-type PMOS transistor P1 is an example of the enhancement-type element.

The depletion-type NMOS transistor D3 has a control terminal and a pair of second main terminals. Here, the control terminal is the gate, and the pair of first main terminals are the source and the drain. Hereinafter, description is given by using the gate as the control terminal, and the source or the drain as the main terminal. The drain of the depletion-type NMOS transistor D3 is connected to the node VJG. The source is connected to node VDVDV. The gate of the depletion-type NMOS transistor D3 is connected via the depletion-type NMOS transistor D1, the resistor R1 and the resistor R2 to ground potential. The gate of the enhancement-type PMOS transistor P1 is connected to the node VDVDV. The depletion-type NMOS transistor D3 is an example of the depletion-type element.

The depletion-type NMOS transistor D2 has a control terminal and a pair of third main terminals. Here, the control terminal is the gate, and the pair of first main terminals are the source and the drain. Hereinafter, description is given by using the gate as the control terminal, and the source or the drain as the main terminal. The drain of the depletion-type NMOS transistor D2 is connected to the node VDVDV that is connected to the source of the depletion-type NMOS transistor D3. The source is connected to the node VDVD. The gate of the depletion-type NMOS transistor D2 is connected via the resistor R2 to ground potential. The gate of the depletion-type NMOS transistor D3 is connected to the node VDVD. The depletion-type NMOS transistor D2 is an example of the depletion-type element.

The depletion-type NMOS transistor D1 has a control terminal and a pair of fourth main terminals. Here, the control terminal is the gate, and the pair of first main terminals are the source and the drain. Hereinafter, description is given by using the gate as the control terminal, and the source or the drain as the main terminal. The drain of the depletion-type NMOS transistor D1 is connected to the node VDVD that is connected to the source of the depletion-type NMOS transistor D2. The source is connected to the node SD1 that is connected to one end of the resistor R1. The gate of the depletion-type NMOS transistor D1 is connected to ground potential. The depletion-type NMOS transistor D1 is an example of the depletion-type element.

At the first resistor portion, the resistor R1 and the resistor R2 are connected in series. One end of the resistor R1 is connected to the node SD1, and the other end of the resistor R1 is connected to the node VDV. One end of the resistor R2 is connected to the node VDV, and the other end of the resistor R2 is connected to ground potential. The gate of the depletion-type NMOS transistor D2 is connected to the node VDV. The resistance values of the resistor R1 and the resistor R2 are respectively set in accordance with the type of the microcontroller.

The input terminal of the inverter INV1 is connected to the node VJG. A reset signal, which is outputted from the output terminal of the inverter INV1 in accordance with the voltage of the node VJG, is supplied from the SRS terminal to an LSI internal circuit or the like in which the power-on reset circuit 310 is incorporated.

Detailed description of the operation of the power-on reset circuit 310 of the present embodiment is omitted. Note that it is assumed that the threshold voltage of the enhancement-type PMOS transistor P1 is P1Vt, the threshold voltage of the depletion-type NMOS transistor D3 is D3Vt, the threshold voltage of the depletion-type NMOS transistor D2 is D2Vt, and the threshold voltage of the depletion-type NMOS transistor D1 is D1Vt.

If VDD is less than the judgment voltage |D3Vt+D1Vt× (division ratio of the resistances of the resistors R1, R2)+ P1Vt+D2Vt|, the enhancement-type PMOS transistor P1 is not completely on, and therefore, there is the reset state that is a state in which the reset signal is outputted. On the other hand, if VDD is greater than or equal to the judgment voltage |D3Vt+D1Vt×(division ratio of the resistances of the resistors R1, R2)+P1Vt+D2Vt|, the enhancement-type PMOS transistor P1 is completely on, and there is the non-reset state that is a state in which the reset signal is not outputted.

Further, when VDD is sufficiently high, the depletion-type NMOS transistor D3, the depletion-type NMOS transistor D2, the depletion-type NMOS transistor D1, the resistor R1 and the resistor R2 function as a constant voltage circuit. Therefore, the current at this time is constant, and the consumed current is |D3Vt+D2Vt+D1Vt|÷(sum of the resistances of the resistors R1, R2). Namely, the current that is consumed does not depend on the enhancement-type PMOS transistor P1 that determines the judgment voltage for outputting the reset signal. Accordingly, the electric power that is consumed does not increase even in a case in which the judgment voltage for outputting the reset signal is set to be high.

Further, without changing the sum of the resistances of the resistor R1 and the resistor R2, the division ratio is changed, and the judgment voltage for outputting the reset signal can be changed. Therefore, the current that is consumed does not increase.

As described above, the power-on reset circuit 310 relating to the present embodiment has: the enhancement-type PMOS transistor P1 whose source is connected to the power supply potential, whose drain is connected to the node VJG, and whose gate is connected to the node VDVDV that is connected to the source of the depletion-type NMOS transistor D3; the depletion-type NMOS transistor D3 whose drain is connected to the node VJG and whose gate is connected to the node VDVD that is connected to the source of the depletion-type NMOS transistor D2; the depletion-type NMOS transistor D2 whose drain is connected to the node VDVDV and whose gate is connected to the node VDV; and the depletion-type NMOS transistor D1 whose drain is connected to the node VDVD, and whose gate is connected to ground potential. The power-on reset circuit 310 has: the resistor portion having the resistors R1, R2 that are connected in series, and whose one end is connected to the source of the depletion-type NMOS transistor D1, and whose other end is connected to ground potential, and at which the region between the resistors R1, R2 is connected to the gate of the depletion-type NMOS transistor D2; and the inverter whose input is connected to the node VJG, and that outputs a reset signal. Due thereto, a power-on reset circuit, at which a judgment voltage for outputting a reset signal can be set in a wide range without increasing the electric power that is consumed, can be realized.

Further, the gate of the enhancement-type PMOS transistor P1 is connected to the source of the depletion-type NMOS transistor D3, and further, the gate of the depletion-type NMOS transistor D2 is connected to the node VDV that is between the resistors R1, R2. Due thereto, by changing the division ratio of the resistors R1 and R2, the judgment voltage for outputting the reset signal at the time when VDD rises can be set. Further, by adding the depletion-type NMOS transistor D3, the judgment voltage for outputting the reset signal can be set to a voltage that is higher, by D3Vt, than that of the second embodiment.

Further, the gate of the depletion-type NMOS transistor D1 is connected to a constant voltage source such as ground potential or the like, and the plural resistors are provided between the source of the depletion-type NMOS transistor D1 and ground potential. Due thereto, the source voltage of the depletion-type NMOS transistor D1 can be set. Further, the depletion-type NMOS transistor D2 is vertically stacked at the drain of the depletion-type NMOS transistor D1, and the node, which divides the set source voltage of the depletion-type NMOS transistor D1, is connected to the gate of the depletion-type NMOS transistor D2, and the gate of the depletion-type NMOS transistor D3 is connected to the source of the depletion-type NMOS transistor D2, and the on state of the enhancement-type PMOS transistor P1 is controlled. Due thereto, the judgment voltage for resetting can be set to be a voltage that is higher than in the second embodiment.

Fourth Embodiment

Figure 6:
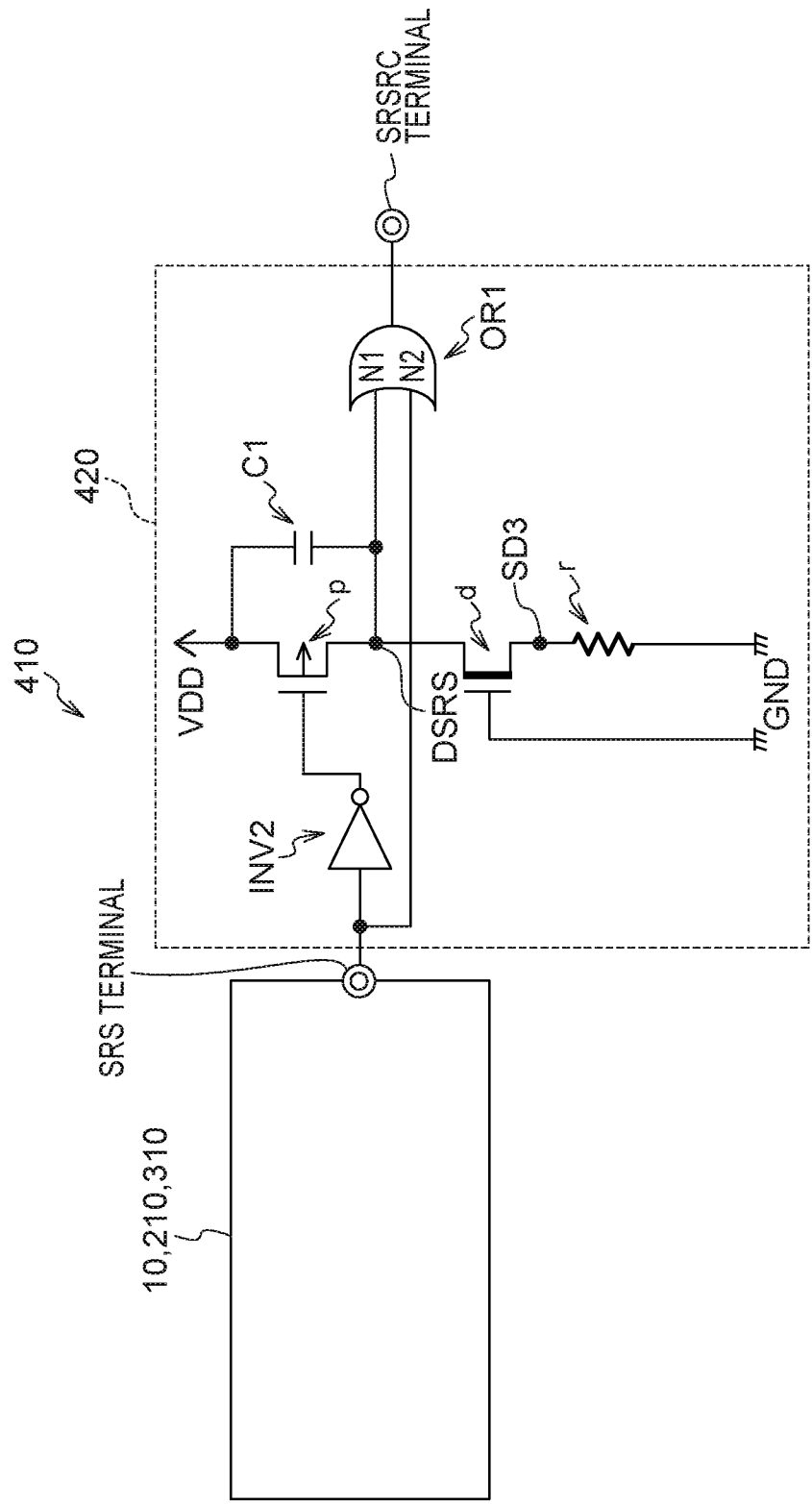
FIG. 6 is a circuit diagram showing an example of a power-on reset circuit of a fourth embodiment.

First, the structure of a power-on reset circuit 410 of the present embodiment is described. A circuit diagram for explaining an example of the power-on reset circuit of the present embodiment is shown in FIG. 6. The power-on reset circuit 410 of the present embodiment is a structure in which a delay circuit 420 is added to the power-on reset circuit 210 of the second embodiment.

At a power-on reset circuit, in a case in which VDD rises steeply when VDD is supplied, there are cases in which the time period over which the reset signal is outputted (hereinafter called the reset time period) is short and is insufficient. Here, in the fourth embodiment, there is a power-on reset circuit that can provide a reset time period that is sufficient even at times when VDD rises steeply in the first embodiment, the second embodiment and the third embodiment.

The power-on reset circuit 410 of the present embodiment is described by using a structure in which the delay circuit 420 is combined with the power-on reset circuit 210 described in the second embodiment. The delay circuit 420 has an inverter INV2, an enhancement-type PMOS transistor p, a depletion-type NMOS transistor d, a resistor portion (resistor r), a capacitor C1 and an OR circuit OR1. The power-on reset circuit 410 is incorporated in an LSI internal circuit for example.

Note that the power-on reset circuit 10 described in the first embodiment or the power-on reset circuit 310 described in the third embodiment may be used instead of the power-on reset circuit 210 described in the second embodiment.

The input terminal of the inverter INV2 is connected to the SRS terminal that is the output of the power-on reset circuit 210. When the input is greater than or equal to a logic threshold voltage that is a predetermined value, the inverter INV2 outputs a value that is the input that has been inverted.

The enhancement-type PMOS transistor p has a control terminal and a pair of fifth main terminals. Here, the control terminal is the gate, and the pair of fifth main terminals are the source and the drain. Hereinafter, description is given by using the gate as the control terminal, and the source or the drain as the main terminal. The source of the enhancement-type PMOS transistor p is connected to the power supply potential, and the drain is connected to node DSRS. The gate of the enhancement-type PMOS transistor p is connected to the output terminal of the inverter INV2. The enhancement-type PMOS transistor p is an example of the enhancement-type element.

The depletion-type NMOS transistor d has a control terminal and a pair of sixth main terminals. Here, the control terminal is the gate, and the pair of sixth main terminals are the source and the drain. Hereinafter, description is given by using the gate as the control terminal, and the source or the drain as the main terminal. The drain of the depletion-type NMOS transistor d is connected to the node DSRS that is connected to the drain of the enhancement-type PMOS transistor p. The source is connected to node SD3. The gate of the depletion-type NMOS transistor d is connected to ground potential. The depletion-type NMOS transistor d is an example of the depletion-type element.

One end of the resistor r that structures the resistor portion is connected to the node SD3 that is connected to the source of the depletion-type NMOS transistor d. The other end of the resistor r is connected to ground potential.

One end of the capacitor C1 is connected to the power supply potential, and the other end is connected to the node DSRS.

One input N1 of the OR circuit OR1 is connected to the node DSRS, and another input N2 of the OR circuit OR1 is connected to the SRS terminal that is the output of the power-on reset circuit 210. The OR circuit OR1 outputs the logical sum of the one input N1 and the other input N2. The output of the OR circuit OR1 is connected to an SRSRC terminal. The reset signal that is outputted from the SRSRC terminal is supplied to an LSI internal circuit or the like in which the power-on reset circuit 310 is incorporated.

Figure 7:
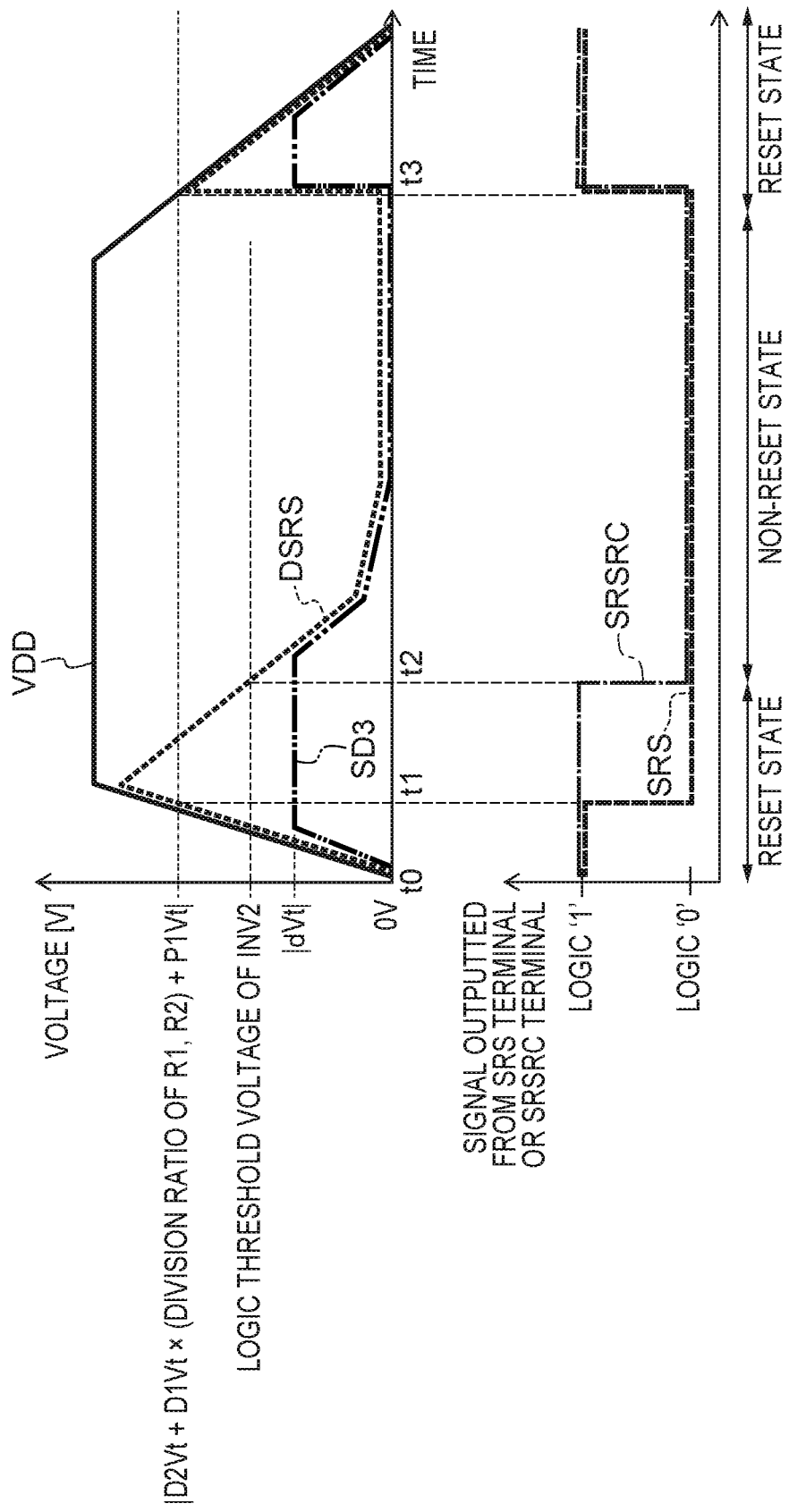
FIG. 7 is a drawing showing an example of voltage waveforms and outputted signals of the power-on reset circuit of the fourth embodiment.

Operation of the power-on reset circuit 410 of the present embodiment is described next. The upper part of FIG. 7 shows voltage waveforms, and the lower part shows the signal that is outputted from the SRS terminal and the signal that is outputted from the SRSRC terminal, which express a reset state or a non-reset state (logic '0' or logic '1'). In the upper part of FIG. 7, the waveform at the time of operation of VDD, the waveform at the time of operation of the voltage of the node DSRS and the waveform at the time of operation of the voltage of the node SD3 are shown by the solid line, the dotted line, and the two-dot chain line, respectively. In the lower part of FIG. 7, the signal outputted from the SRS terminal and the signal outputted from the SRSRC terminal are shown by the dotted line and the one-dot chain line, respectively.

Note that it is assumed that the threshold voltage of the enhancement-type PMOS transistor p is pVt, and the threshold voltage of the depletion-type NMOS transistor d is dVt. The threshold voltage dVt of the depletion-type NMOS transistor d is a negative value, and is on even when the source is 0V and the gate is 0V.

First, during the time period when the time is greater than or equal to time t0 and less than time t1, VDD increases steeply up to the judgment voltage for outputting the reset signal. At this time, the signal that is outputted from the SRS terminal is logic '1'. When the signal that is outputted from the SRS terminal is logic 1', the signal outputted from the inverter INV2 is logic '0' and is GND level. Therefore, the enhancement-type PMOS transistor p is on, and the voltage of the node DSRS of the drain of the depletion-type NMOS transistor d is pulled toward the VDD side and becomes high voltage, and the voltage of the node DSRS becomes VDD level which is a state of having reached VDD. At this time, because the gate of the depletion-type NMOS transistor d is connected to GND, the voltage of the node SD3 of the source of the depletion-type NMOS transistor d becomes around |dVt|, and does not rise any more than this and becomes a constant voltage. Further, because VDD level is inputted to the one input N1 of the OR circuit OR1, and VDD level is inputted to the another input N2, by computing the logical sum, the signal outputted from the SRSRC terminal becomes logic '1'. At this time, a state in which the reset signal is outputted from the SRSRC terminal, i.e., the reset state, is established.

Next, at time t1, when VDD rises further, the signal outputted from the SRS terminal becomes logic '0', and GND level is inputted to the another input N2 of the OR circuit OR1, but VDD level is inputted to the one input N1 of the OR circuit OR1. Therefore, by computing the logical sum, the signal outputted from the SRSRC terminal is logic '1'. At this time, there is a state in which the reset signal is outputted from the SRSRC terminal, i.e., the reset state.

Next, at time t2, due to the signal that is outputted from the SRS terminal becoming logic '0' at time t1, the signal that is outputted from the inverter INV2 becomes logic '1' and becomes VDD level. At this time, the enhancement-type PMOS transistor p turns off. When the enhancement-type PMOS transistor p turns off, the capacitor C1 is charged slowly by current I2 that flows through the resistor r and the depletion-type NMOS transistor d. Therefore, the voltage of the node DSRS of the drain of the depletion-type NMOS transistor d slowly transitions to 0V. Then, when the node DSRS becomes less than the logic threshold voltage of the inverter INV2, GND level is inputted to the one input N1 of the OR circuit OR1, and GND level is inputted to the another input N2. Therefore, by computing the logical sum, the signal that is outputted from the SRSRC terminal becomes logic '0'. At this time, the state in which a reset signal is not outputted from the SRSRC terminal, i.e., the non-reset state, is established. Accordingly, during the rise of VDD, when the voltage of the node DSRS, which is the one input N1 of the OR circuit OR1, is greater than or equal to the logic threshold voltage of the inverter INV2, i.e., in cases in which the time is greater than or equal to time t1 and less than time t2, there is the reset state. Further, when the voltage of the node DSRS, which is the one input N1 of the OR circuit OR1, is less than the logic threshold voltage of the inverter INV2, i.e., in cases in which the time is greater than or equal to time t2 and less than time t3, there is the non-reset state.

Further, when VDD falls at time t3, because the signal outputted from the SRS terminal is logic '1', and VDD level is inputted to the another input N2 of the OR circuit OR1, the signal that is outputted from the SRSRC terminal becomes logic '1' immediately. Accordingly, even in cases in which VDD falls steeply, the reset state is established immediately.

Namely, at the power-on reset circuit 410 of the present embodiment, a delay time arises due to the capacitor C1 charging slowly. Therefore, the time period in which the signal outputted from the SRSRC terminal is logic '1' is long as compared with the time period in which the signal outputted from the SRS terminal is logic '1'. Namely, at the power-on reset circuit 410 of the present embodiment, the reset time can be made to be longer than in the power-on reset circuit 210 described in the second embodiment.

Further, it is assumed that VDD is 2V, the logic threshold value of the OR circuit OR1 is 1V, the capacitor C1 is 100 pF, the resistor r is 4 MΩ, and the threshold voltage dVt of the depletion-type NMOS transistor d is −0.4V. The current is 0.4V÷4 MΩ, i.e., is 0.1 uA. In order to vary the voltage of the capacitor C1 by 1V, 100 pF 0.1 uA, i.e., 1 msec, is required. Approximately 0.28 msec is required to become 1V when the capacitor C1 and the resistor r are directly connected. Accordingly, the reset time period can be extended greatly by connecting the depletion-type NMOS transistor d to the resistor r.

As described above, the power-on reset circuit 410 relating to the fourth embodiment has the enhancement-type PMOS transistor p, the depletion-type NMOS transistor d, the resistor r and the capacitor C1. Due thereto, in addition to the effects obtained by the above-described first embodiment or second embodiment, the effect of being able to provide a sufficient reset time period with respect to a sudden rise in VDD is achieved.

Moreover, by providing the depletion-type NMOS transistor d and the resistor r, the effect of lengthening the reset time period is achieved even at a low resistance.

Further, when the signal outputted from the SRS terminal becomes logic '1', a path is provided that directly connects to the input of the OR circuit OR1 without going through a circuit that gives rise to delays. Therefore, logic '1' of the SRS signal, i.e., the reset state, can be outputted quickly with respect to a sudden fall in VDD.

Further, the resistor r is provided between the source of the depletion-type NMOS transistor d and ground potential, and the time period over which the capacitor C1 is charged can be made to be long even at a low resistance. Note that, although the resistor r has been described as an example of the resistor portion here, the resistor portion is not limited to this, and there may be plural resistors that are added.

Further, a path, which directly connects logic '1' of the signal outputted from the SRS terminal to the input of the OR circuit OR1, is provided, and a path, which connects logic '0' of the signal outputted from the SRS terminal to the input of the OR circuit OR1 via the delay circuit, is provided. Due thereto, an effective reset can be outputted both in cases in which VDD falls steeply and in cases in which VDD rises steeply.

Fifth Embodiment

Figure 8:
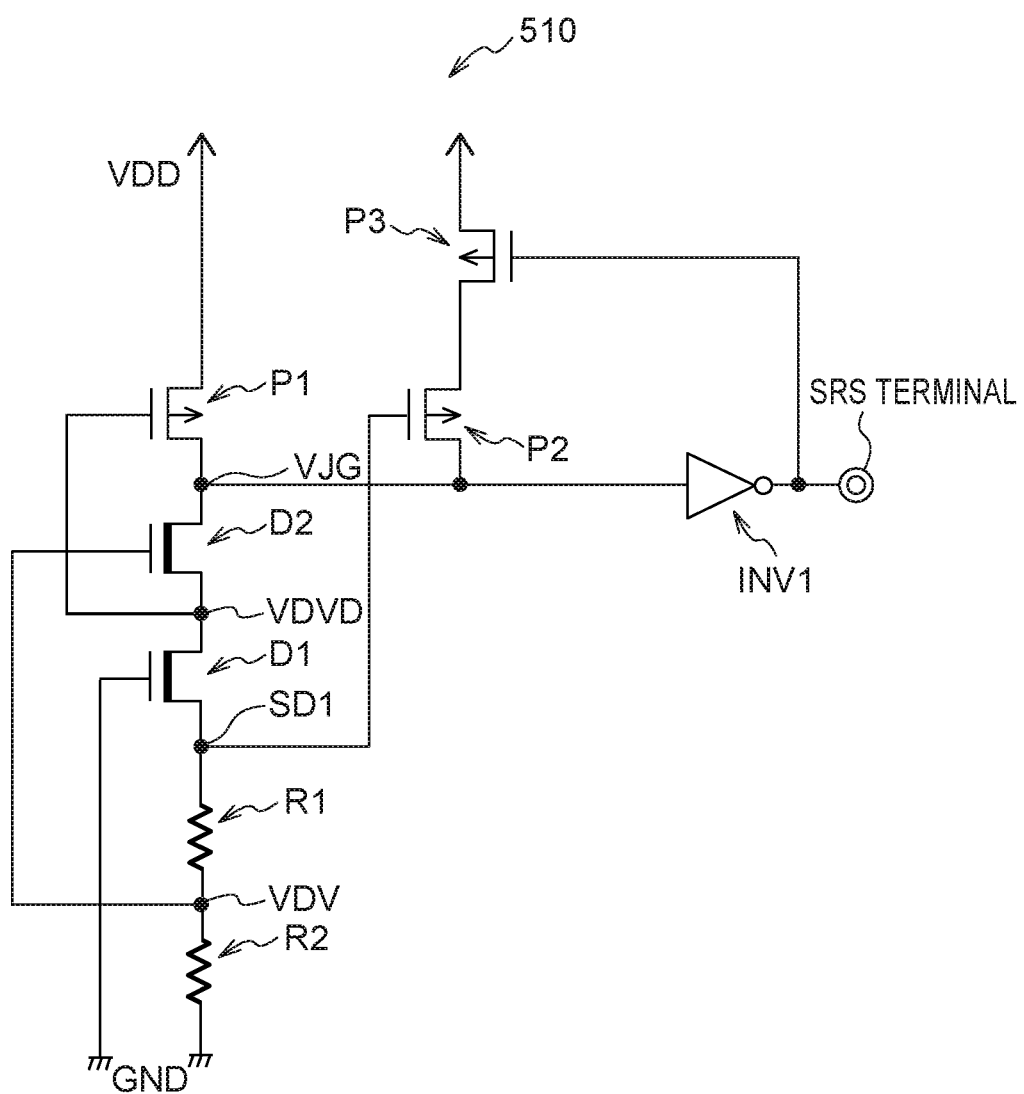
FIG. 8 is a circuit diagram showing an example of a power-on reset circuit of a fifth embodiment.

First, the structure of a power-on reset circuit 510 of the present embodiment is described. A circuit diagram for explaining an example of the power-on reset circuit of the present embodiment is shown in FIG. 8. The power-on reset circuit 510 of the present embodiment is a structure in which two enhancement-type PMOS transistors are added to the power-on reset circuit 210 of the second embodiment, and differs from the power-on reset circuit 210 of the second embodiment. Because the other points in FIG. 8 are the same of those of the case of FIG. 3, description is given by denoting the same or corresponding portions by the same reference numerals.

At a power-on reset circuit, problems arise due to noise being superposed on VDD and so-called chattering arising. For example, in the second embodiment, there are cases in which, after the enhancement-type PMOS transistor P1 turns on completely, chattering arises, and the enhancement-type PMOS transistor P1 is no longer completely on. If instances of the enhancement-type PMOS transistor P1 being completely on and not being completely on in this way are repeated, the reset state and the non-reset state are repeated, and the internal circuit cannot be operated stably. Thus, the fifth embodiment is the power-on reset circuit of the above-described second embodiment that is even more resistant to noise and that can operate an internal circuit even more stably.

Note that the power-on reset circuit 310 described in the third embodiment may be used instead of the power-on reset circuit 210 described in the second embodiment.

The power-on reset circuit 510 of the present embodiment further has, with respect to the power-on reset circuit 210 of the second embodiment, an enhancement-type PMOS transistor P2 and an enhancement-type PMOS transistor P3.

The enhancement-type PMOS transistor P2 has a control terminal and a pair of seventh main terminals. Here, the control terminal is the gate, and the pair of seventh main terminals are the source and the drain. Hereinafter, description is given by using the gate as the control terminal, and the source or the drain as the main terminal. The drain of the enhancement-type PMOS transistor P2 is connected to the node VJG. The gate of the enhancement-type PMOS transistor P2 is connected to the node SD1 that is connected to the source of the depletion-type NMOS transistor D1.

The enhancement-type PMOS transistor P3 has a control terminal and a pair of eighth main terminals. Here, the control terminal is the gate, and the pair of eighth main terminals are the source and the drain. Hereinafter, description is given by using the gate as the control terminal, and the source or the drain as the main terminal. The source of the enhancement-type PMOS transistor P3 is connected to the power supply potential, and the drain is connected to the source of the enhancement-type PMOS transistor P2. The gate of the enhancement-type PMOS transistor P3 is connected the SRS terminal that is the output of the inverter INV1.

Figure 9:
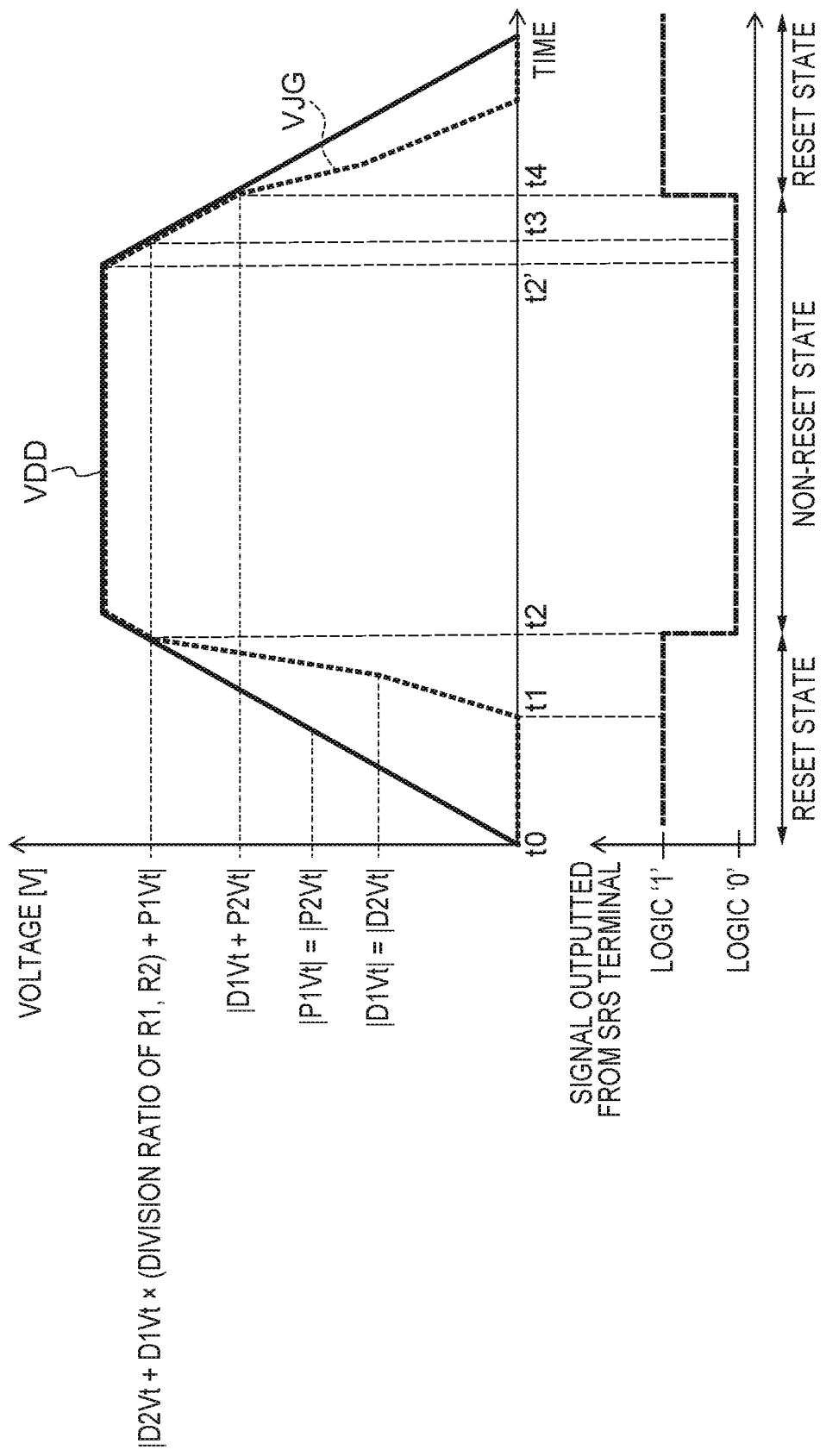
FIG. 9 is a drawing showing an example of voltage waveforms and an outputted signal of the power-on reset circuit of the fifth embodiment.

Operation of the power-on reset circuit 510 of the present embodiment is described next. Here, for simplicity, description is given by using the voltage waveforms of VDD and the node VJG. The upper part of FIG. 9 shows the voltage waveforms, and the lower part shows the signal that is outputted from the SRS terminal and that expresses a reset state or a non-reset state (logic '0' or logic '1'). In the upper part of FIG. 9, the waveform at the time of operation of VDD and the waveform at the time of operation of the voltage of the node VJG are shown by the solid line and the dotted line, respectively.

First, during the time period when the time is greater than or equal to time t0 and less than time t2, VDD starts to rise from 0V. At this time, the signal outputted from the inverter INV1 and the signal outputted from the SRS terminal are logic '1' and are VDD level, and therefore, the enhancement-type PMOS transistor P3 is off. At this time, the newly-provided enhancement-type PMOS transistors P2, P3 operate in the same way as in the second embodiment, without affecting operation of the power-on reset circuit 510. Accordingly, the time period in which the time is greater than or equal to time t0 and less than time t2 and in which VDD is less than a first judgment voltage |D2Vt+D1Vt×(division ratio of the resistances of the resistors R1, R2)+P1Vt| is the reset state that is the state in which the reset signal is being outputted. Further, the time period that is greater than or equal to time t2 and less than time t2' and in which VDD is greater than or equal to the first judgment voltage |D2Vt+D1Vt×(division ratio of the resistances of the resistors R1, R2)+P1Vt| is the non-reset state that is the state in which the reset signal is not being outputted.

Further, during the time period in which the time is greater than or equal to time t2' and less than time t3, VDD starts to fall from a voltage that is higher than the judgment voltage |D2Vt+D1Vt×(division ratio of the resistances of the resistors R1, R2)+P1Vt| for outputting the reset signal in the above-described second embodiment. At this time, the signal outputted from the inverter INV1 and the signal outputted from the SRS terminal are logic '0' and are GND level, and therefore, the enhancement-type PMOS transistor P3 is on. Further, current I3 that flows through the enhancement-type PMOS transistor P2 flows-into the drain of the depletion-type NMOS transistor D2, in parallel with the current I1 that flows through the enhancement-type PMOS transistor P1. Due thereto, in a case in which the resistance values of the resistor R1 and the resistor R2 are sufficiently high, the voltage of the node VDV of the gate of the enhancement-type PMOS transistor P1 rises by (I1+I3)×(resistance value of the resistor R2), and therefore, the enhancement-type PMOS transistor P1 is not completely on. At this time, the gate of the enhancement-type PMOS transistor P2 is a voltage that is lower than the gate of the enhancement-type PMOS transistor P1, and as compared with the gate voltage of the enhancement-type PMOS transistor P2, the source voltage is higher than P2Vt. Therefore, the enhancement-type PMOS transistor P2 is completely on. Then, the drain of the enhancement-type PMOS transistor P2 is pulled toward the VDD side and becomes high voltage, and, in accordance with the voltage of the node VJG being VDD level which is the state of having reached VDD, the signal that is outputted from the inverter INV1 does not change and is logic '0'. Further, the non-reset state continues.

Further, at time t4, VDD falls further, and when VDD becomes less than |D1Vt+P2Vt|, the enhancement-type PMOS transistor P2 is not completely on. Further, in accordance with the voltage of the node VJG becoming GND level, the signal outputted from the inverter INV1 and the signal outputted from the SRS terminal become logic '1'. Further, the reset state is established. Accordingly, VDD=|D1Vt+P2Vt|, at which the reset state and the non-reset state are switched, is the second judgment voltage. Note that, during the time period in which the time is greater than or equal to time t3 and less than time t4, VDD is greater than or equal to |D1Vt+P2Vt|, and therefore, there is the non-reset state.

Namely, the judgment voltage for outputting the reset signal at the time when VDD starts to rise from 0V is the first judgment voltage |D2Vt+D1Vt×(division ratio of the resistances of the resistors R1, R2)+P1Vt|, and the judgment voltage for outputting the reset signal at the time when VDD starts to fall from a voltage higher than this judgement voltage is the second judgment voltage |D1Vt+P2Vt|.

Accordingly, at the time when VDD starts to rise from 0V, the enhancement-type PMOS transistor P1 determines the judgment voltage for outputting the reset signal. At the time when VDD starts to fall from a voltage that is higher than the judgment voltage for outputting the reset signal, the enhancement-type PMOS transistor P2 determines the judgment voltage for outputting the reset signal.

As described above, in the power-on reset circuit 510 relating to the fifth embodiment, by providing the enhancement-type PMOS transistors P2, P3, the judgment voltage for outputting the reset signal at the time when VDD rises, and the judgment voltage for outputting the reset signal at the time when VDD falls, are made to be different values. Due thereto, hysteresis can be produced. Namely, the judgment voltage for outputting the reset signal is provided with hysteresis, and the occurrence of chattering can be prevented.

Sixth Embodiment

Figure 10:
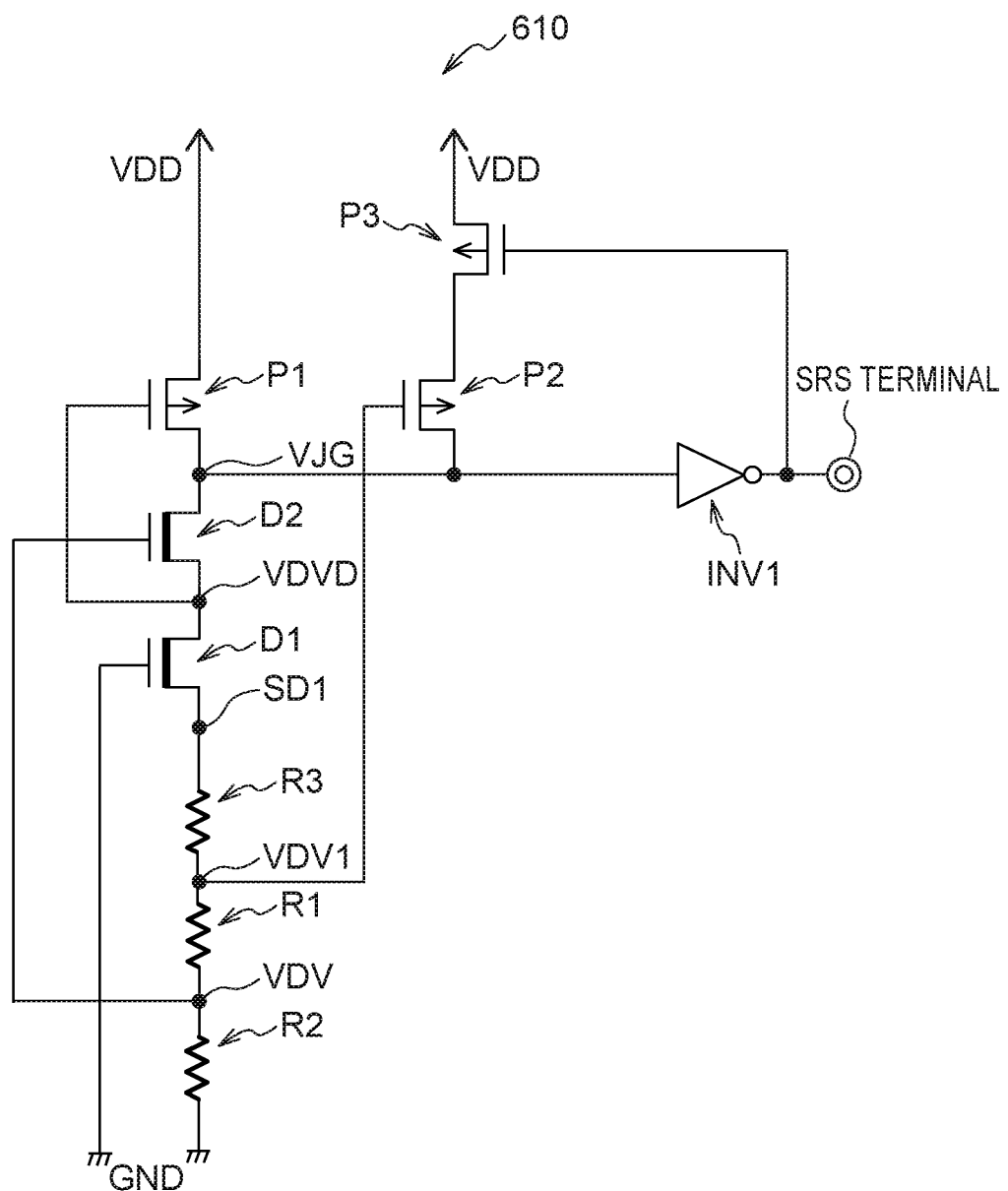
FIG. 10 is a circuit diagram showing an example of a power-on reset circuit of a sixth embodiment.

First, the structure of the power-on reset circuit of the present embodiment is described. A circuit diagram for explaining an example of the power-on reset circuit of the present embodiment is shown in FIG. 10. A power-on reset circuit 610 of the present embodiment is a structure in which a second resistor portion (resistor R3) is added to the power-on reset circuit 510 of the fifth embodiment. Because the other points in FIG. 10 are the same of those of the case of FIG. 8, description is given by denoting the same or corresponding portions by the same reference numerals.

The power-on reset circuit 610 of the present embodiment further has, with respect to the fifth embodiment, the resistor R3 between the gate of the enhancement-type PMOS transistor P2 and the source of the depletion-type NMOS transistor D1.

The resistor R3 that structures the second resistor portion is connected in series to the first resistor portion (the resistors R1, R2), and is connected to ground potential via the first resistor portion (the resistors R1, R2). One end of the resistor R3 is connected to the source of the depletion-type NMOS transistor D1, and another end is connected to node VDV1 of the gate of the enhancement-type PMOS transistor P2.

In the fifth embodiment, an example is described in which the gate of the enhancement-type PMOS transistor P2 is connected to the source of the depletion-type NMOS transistor D1. In the present embodiment, the gate of the enhancement-type PMOS transistor P2 and the depletion-type NMOS transistor D1 are connected via the resistor R3. Due thereto, the difference between the voltage of the gate of the enhancement-type PMOS transistor P1 and the voltage of the gate of the enhancement-type PMOS transistor P2 can be broadened, and the hysteresis width can be broadened.

In this way, the enhancement-type PMOS transistors P2, P3 are provided in series between VDD and the node VJG, and a resistor is provided between the gate of the enhancement-type PMOS transistor P2 and the gate of the enhancement-type PMOS transistor P1. Due thereto, the hysteresis width of the judgment voltage for outputting the reset signal can be adjusted.

Here, an example of a case in which the resistor R3 is added as the second resistor portion is described, but the present disclosure is not limited to this, and there may be plural resistors that are added.

Figure 11:
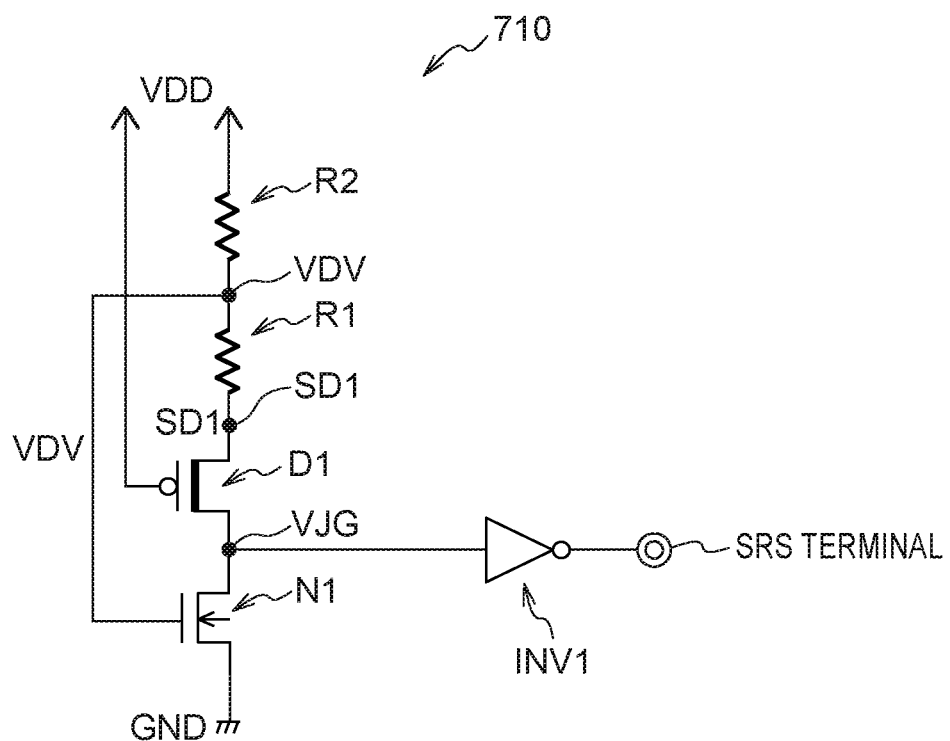
FIG. 11 is circuit diagram showing an example of a power-on reset circuit that is a modified example of the power-on reset circuit of the first embodiment.

Note that, in the above-described embodiments describe, as examples, cases in which an enhancement-type PMOS transistor is used as the enhancement-type element, and a depletion-type NMOS transistor is used as the depletion-type element. However, the present disclosure is not limited to this. An enhancement-type NMOS transistor may be used as the enhancement-type element, and a depletion-type PMOS transistor may be used as the depletion-type element. For example, a power-on reset circuit 710 shown in FIG. 11 may be used as a modified example of the power-on reset circuit 10 of the first embodiment.

Further, although structures of the power-on reset circuits described in the above embodiments have been described, the present disclosure is not limited to this. The power-on reset circuit may be structured by using an enhancement-type element, a depletion-type element portion, and a resistor portion. One of the source and the drain of the enhancement-type element is connected to a region having a first potential such as power supply potential or ground potential or the like, and the other of the source and the drain is electrically connected to a first node, and the gate is connected to the other of the source and the drain of the depletion-type element, which is the nearest to the enhancement-type element, of the depletion-type element portion. Further, at this depletion-type element portion, one or more depletion-type elements, at which one of the source and the drain is connected to the first potential side and the other of the source and the drain is connected to a second potential side that is different than the first potential, are connected in series, and the depletion-type element portion is connected between the first node and a second node. One end of the resistor portion is electrically connected to the second node, and the other end is connected to the region having the second potential.

Further, at the depletion-type element portion, it suffices for the gate of the depletion-type element, which is nearest to the region having the second potential at the depletion-type element portion, to be connected to the region having the second potential.

Further, in a case in which there are two or more depletion-type elements at the depletion-type element portion, it suffices for the gate of the depletion-type element, which is the Nth (N≥2) depletion-type element as counted from the region having the second potential, to be connected to the other of the source and the drain of the (N−1)st depletion-type element.

Further, the structures, operations, respective processings, and the like of the power-on reset circuits 10, 210, 310, 410, 510, 610, 710 and the control terminals and the like, which have been described in the respective embodiments, are examples, and it goes without saying that they can be modified in accordance with the situation within a scope that does not depart from the gist of the present invention.

What is claimed is:

1. A semiconductor device, comprising:
   a first enhancement-type element having a first control terminal and a pair of first main terminals, one of the first main terminals being connected to a region having a first potential, and another of the first main terminals being connected to a first node;
   a first depletion-type element having a second control terminal and a pair of second main terminals, one of the second main terminals being connected to the first node, and the second control terminal being connected to a region having a second potential;
   a first resistor portion having a plurality of resistor elements connected in series, and having one end connected to another of the second main terminals of the first depletion-type element, and another end connected to the region having the second potential, a region between the plurality of resistor elements being connected to the first control terminal of the first enhancement-type element; and
   a first inverter having an input that is connected to the first node and outputting a reset signal.

2. The semiconductor device of claim 1, further comprising:
   a second inverter having an input that is connected to an output of the first inverter;
   an enhancement-type element having a fifth control terminal and a pair of fifth main terminals, one of the fifth main terminals being connected to the region having the first potential, and another of the fifth main terminals being connected to a third node;
   a depletion-type element having a sixth control terminal and a pair of sixth main terminals, one of the sixth main terminals being connected to the third node;
   a resistor portion having one end connected to another of the sixth main terminals of the depletion-type element, and another end connected to the region having the second potential;
   a capacitor having one end connected to the region having the first potential, and whose another end connected to the third node; and
   an OR circuit that outputs a logical sum of the third node and the output of the first inverter as the reset signal.

* * * * *